US011476131B2

(12) United States Patent
Ozaki

(10) Patent No.: US 11,476,131 B2
(45) Date of Patent: Oct. 18, 2022

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventor: Takashi Ozaki, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 16/125,060

(22) Filed: Sep. 7, 2018

(65) Prior Publication Data

US 2019/0080936 A1 Mar. 14, 2019

(30) Foreign Application Priority Data

Sep. 8, 2017 (JP) .............................. JP2017-172804

(51) Int. Cl.
*H01L 21/67* (2006.01)
*H01J 37/32* (2006.01)
(Continued)

(52) U.S. Cl.
CPC .... *H01L 21/67069* (2013.01); *C23C 16/4405* (2013.01); *C23C 16/4412* (2013.01);
(Continued)

(58) Field of Classification Search
CPC ........... H01L 21/67069; H01L 21/3065; H01L 21/0214; H01L 21/02271; H01L 21/02334;
(Continued)

(56) References Cited

U.S. PATENT DOCUMENTS 6,383,300 B1* 5/2002 Saito ..................... C23C 16/345
118/715
8,999,858 B2* 4/2015 Koshi ..................... C23C 16/24
438/758
(Continued)

FOREIGN PATENT DOCUMENTS

JP 2000-223430 A 8/2000
JP 2002-222805 A 8/2002
(Continued)

OTHER PUBLICATIONS

Taiwanese Office Action dated Jun. 11, 2019 for the Taiwanese Patent Application No. 107130995.
(Continued)

*Primary Examiner* — Duy Vu N Deo
*Assistant Examiner* — Christopher Remavege
(74) *Attorney, Agent, or Firm* — Volpe Koenig

(57) ABSTRACT

There is provided a technique that includes: processing a substrate in a process vessel by supplying a processing gas to the substrate and exhausting the processing gas from an exhaust part including an exhaust pipe and a pump; cleaning an interior of the exhaust part by supplying a first cleaning gas from a supply port installed in the exhaust pipe directly into the exhaust pipe; and cleaning an interior of the process vessel by supplying a second cleaning gas into the process vessel, wherein a frequency of performing the act of cleaning the interior of the exhaust part is set higher than a frequency of performing the act of cleaning the interior of the process vessel.

13 Claims, 6 Drawing Sheets

(51) Int. Cl.
  *C23C 16/52* (2006.01)
  *C23C 16/44* (2006.01)
  *H01L 21/3065* (2006.01)

(52) U.S. Cl.
  CPC ........ *C23C 16/52* (2013.01); *H01J 37/32862* (2013.01); *H01L 21/3065* (2013.01)

(58) Field of Classification Search
  CPC ................ C23C 16/52; C23C 16/4412; C23C 16/4405; H01J 37/32862
  See application file for complete search history.

(56) References Cited

U.S. PATENT DOCUMENTS

| | | | |
|---|---|---|---|
| 9,340,872 B2* | 5/2016 | Kogura | C23C 16/30 |
| 9,390,933 B2* | 7/2016 | Narushima | H01L 21/31116 |
| 9,773,661 B2* | 9/2017 | Nitta | C23C 16/45527 |
| 9,865,451 B2* | 1/2018 | Noda | C23C 16/4405 |
| 10,131,992 B2* | 11/2018 | Nishiura | C23C 16/52 |
| 10,156,012 B2* | 12/2018 | Kameda | C23C 16/402 |
| 2002/0073923 A1* | 6/2002 | Saito | C23C 16/4405 |
| | | | 118/715 |
| 2004/0255854 A1* | 12/2004 | Sakai | C23C 16/4405 |
| | | | 118/715 |
| 2007/0207625 A1* | 9/2007 | Aggarwal | C23C 16/4412 |
| | | | 438/758 |
| 2008/0076264 A1* | 3/2008 | Okabe | C23C 16/4405 |
| | | | 438/758 |
| 2009/0320881 A1* | 12/2009 | Aitchison | C23C 16/4412 |
| | | | 134/22.1 |
| 2012/0015525 A1* | 1/2012 | Endo | C23C 14/3414 |
| | | | 438/758 |
| 2013/0164943 A1* | 6/2013 | Koshi | C23C 16/24 |
| | | | 438/758 |
| 2015/0000695 A1* | 1/2015 | Noda | C23C 16/4405 |
| | | | 134/1.1 |

FOREIGN PATENT DOCUMENTS

| | | |
|---|---|---|
| JP | 2006-202945 A | 8/2006 |
| JP | 2008-294121 A | 12/2008 |
| JP | 2013-153159 A | 8/2013 |
| JP | 2015-012198 A | 1/2015 |
| JP | 2017-020091 A | 1/2017 |
| KR | 20130075677 A | 7/2013 |
| TW | 201209916 A | 3/2012 |

OTHER PUBLICATIONS

Korean Office Action dated Sep. 9, 2019 for the Korean Patent Application No. 10-2018-0106437.
Japanese Office Action dated Jan. 14, 2020 for the Japanese Patent Application No. 2017-172804.
Japanese Office Action dated Jul. 6, 2021 for Japanese Patent Application No. 2020-142381.

* cited by examiner

FIG. 5A

| 1-300 | P | 301-500 | C | 501-600 | P | 601-900 | P | 901-1000 | C | 1001-1200 | P | 1201-1500 | C | P | 1501-1800 | P | 1801-2000 | C |

FIG. 5B

| | C | | C | | C | C P |
|---|---|---|---|---|---|---|
| 1-500 | | 501-1000 | | 1001-1500 | | 1501-2000 |
| E | | E | | E | | E |

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2017-172804, filed on Sep. 8, 2017, the entire contents of which are incorporated herein by reference.

TECHNICAL FIELD

The present disclosure relates to a method of manufacturing a semiconductor device, a substrate processing apparatus, and a recording medium.

BACKGROUND

In the related art, as an example of processes of manufacturing a semiconductor device, a process of processing a substrate is often carried out by supplying a processing gas to the substrate in a process vessel and exhausting it from an exhaust part including an exhaust pipe and a pump. By performing this process, when a predetermined amount of byproduct adheres to the interior of the process vessel or the like, the interior of the process vessel or the like may be cleaned at a predetermined timing. Also, when the byproduct adheres to the interior of the exhaust part, the maintenance of the exhaust part may be performed at a predetermined timing.

SUMMARY

Some embodiments of the present disclosure provide a technique capable of reducing a maintenance frequency of an exhaust part.

According to one embodiment of the present disclosure, there is provided a technique, which includes: processing a substrate in a process vessel by supplying a processing gas to the substrate and exhausting the processing gas from an exhaust part including an exhaust pipe and a pump; cleaning an interior of the exhaust part by supplying a first cleaning gas from a supply port installed in the exhaust pipe directly into the exhaust pipe; and cleaning an interior of the process vessel by supplying a second cleaning gas into the process vessel, wherein a frequency of performing the act of cleaning the interior of the exhaust part is set higher than a frequency of performing the act of cleaning the interior of the process vessel.

BRIEF DESCRIPTION OF DRAWINGS

FIG. 5A is a diagram illustrating a maintenance frequency of an exhaust part when a first cleaning process is not performed, and FIG. 5B is a diagram illustrating a maintenance frequency of the exhaust part when the first cleaning process is performed.

DETAILED DESCRIPTION

One Embodiment of the Present Disclosure

One embodiment of the present disclosure will now be described with reference to FIGS. 1 to 4.

(1) Configuration of the Substrate Processing Apparatus

Figure 1:
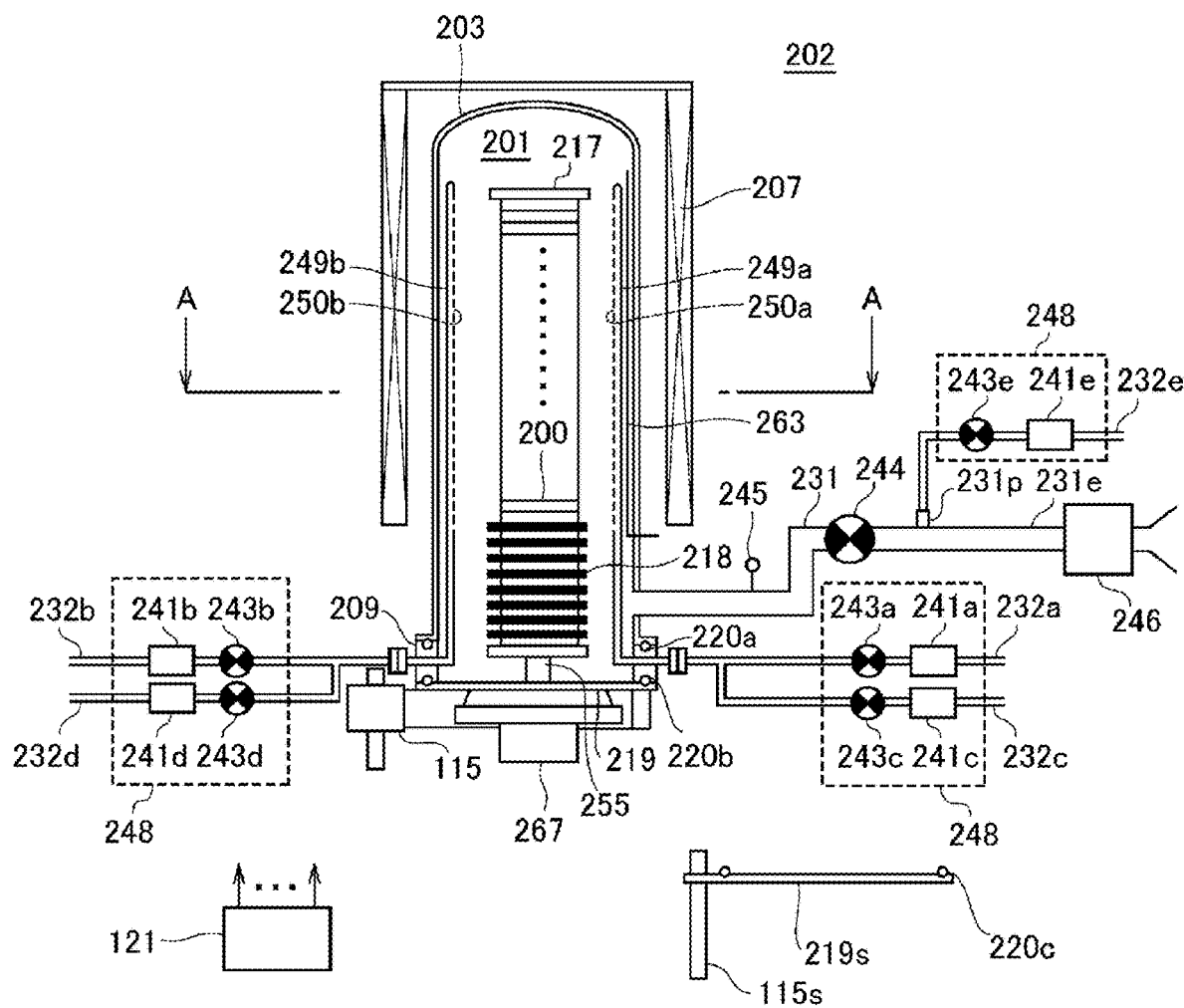
FIG. 1 is a schematic configuration diagram of a vertical type processing furnace of a substrate processing apparatus used in one embodiment of the present disclosure, in which a portion of the processing furnace is shown in a vertical cross sectional view.

As illustrated in FIG. 1, a processing furnace 202 includes a heater 207 as a heating mechanism (temperature adjustment part). The heater 207 has a cylindrical shape and is supported by a retaining plate so as to be vertically installed. The heater 207 also functions as an activation mechanism (an excitation part) configured to thermally activate (excite) gas.

A reaction tube 203 is disposed inside the heater 207 to be concentric with the heater 207. The reaction tube 203 is made of a heat resistant material such as, e.g., quartz ($SiO_2$), silicon carbide (SiC) or the like and has a cylindrical shape with its upper end closed and its lower end opened. A manifold 209 is disposed below the reaction tube 203 in a concentric relationship with the reaction tube 203. The manifold 209 is made of a metal material such as, e.g., stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. Similar to the heater 207, the reaction tube 203 is vertically installed. A process vessel (reaction vessel) is mainly configured by the reaction tube 203 and the manifold 209. A process chamber 201 is formed in a hollow cylindrical portion of the process vessel. The process chamber 201 is configured to accommodate wafers 200 as substrates.

Nozzles 249a and 249b are installed in the process chamber 201 so as to penetrate a sidewall of the manifold 209. Gas supply pipes 232a and 232b are respectively connected to the nozzles 249a and 249b.

Mass flow controllers (MFCs) 241a and 241b, which are flow rate controllers (flow rate control parts), and valves 243a and 243b, which are opening/closing valves, are installed in the gas supply pipes 232a and 232b sequentially from the corresponding upstream sides, respectively. Gas supply pipes 232c and 232d are respectively connected to the gas supply pipes 232a and 232b at the downstream side of the valves 243a and 243b. MFCs 241c and 241d, and valves 243c and 243d are respectively installed in the gas supply pipes 232c and 232d sequentially from the corresponding upstream sides.

Figure 2:
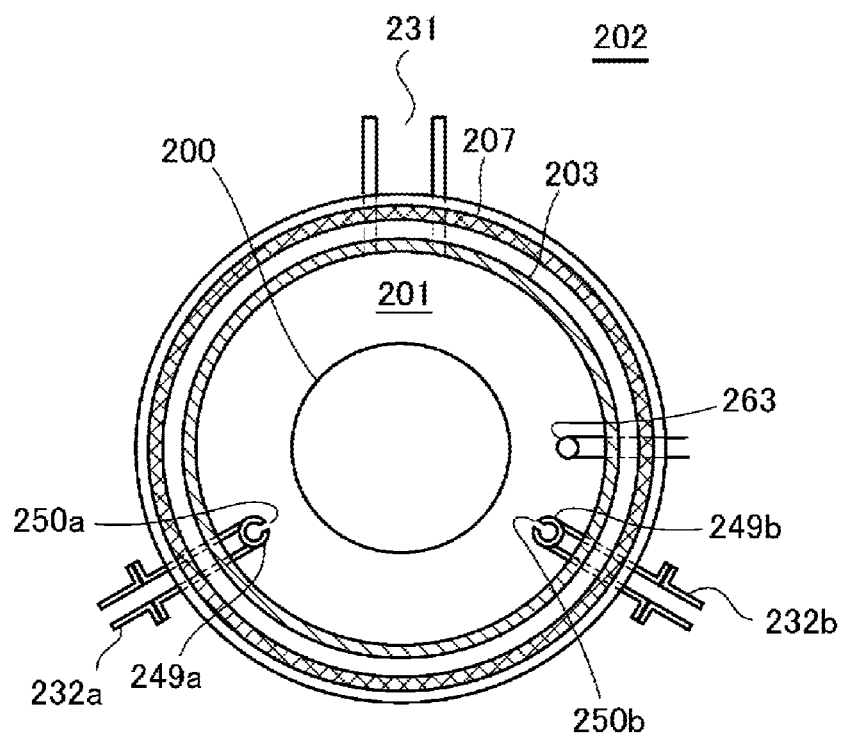
FIG. 2 is a schematic configuration diagram of the vertical type processing furnace of the substrate processing apparatus suitably used in one embodiment of the present disclosure, in which a portion of the processing furnace is shown in a cross sectional view taken along line A-A in FIG. 1.

As illustrated in FIG. 2, the nozzles 249a and 249b are disposed in a space with an annular plan-view shape between the inner wall of the reaction tube 203 and the wafers 200 such that nozzles 249a and 249b extend upward along a stacking direction of the wafers 200 from a lower portion of the inner wall of the reaction tube 203 to an upper portion of the inner wall of the reaction tube 203. That is, the nozzles 249a and 249b are installed at a lateral side of a wafer arrangement region in which the wafers 200 are arranged, namely in a region which horizontally surrounds the wafer arrangement region, so as to extend along the wafer arrangement region. Gas supply holes 250a and 250b for supplying a gas are formed on the side surfaces of the nozzles 249a and 249b, respectively. The gas supply holes 250a and 250b are respectively opened toward the center of the reaction tube 203 so as to allow a gas to be supplied toward the wafers 200. The gas supply holes 250a and 250b may be formed in a plural number between the lower portion of the reaction tube 203 and the upper portion of the reaction tube 203.

An Si-containing gas (halosilane gas), which contains silicon (Si) as a predetermined element (main element) and a halogen element, is supplied as a processing gas (precursor gas) from the gas supply pipe 232a into the process chamber 201 via the MFC 241a, the valve 243a, and the nozzle 249a. As the halosilane gas, it may be possible to use, for example, a chlorosilane gas containing Cl. As the chlorosilane gas, it may be possible to use, for example, a hexachlorodisilane ($Si_2Cl_6$, abbreviation: HCDS) gas.

A fluorine ($F_2$) gas as a second cleaning gas is supplied from the gas supply pipe 232a into the process chamber 201 via the MFC 241a, the valve 243a, and the nozzle 249a.

An N-containing gas (nitriding agent), as a processing gas (nitriding gas), is supplied from the gas supply pipe 232b into the process chamber 201 via the MFC 241b, the valve 243b, and the nozzle 249b. As the N-containing gas, it may be possible to use, for example, an ammonia ($NH_3$) gas.

An O-containing gas (oxidizing agent) as a processing gas (oxidizing gas) is supplied from the gas supply pipe 232b into the process chamber 201 via the MFC 241b, the valve 243b, and the nozzle 249b. As the O-containing gas, it may be possible to use, for example, an oxygen ($O_2$) gas.

An inert gas is supplied from the gas supply pipes 232c and 232d into the process chamber 201 via the MFCs 241c and 241d, the valves 243c and 243d, the gas supply pipes 232a and 232b, and the nozzles 249a and 249b. As the inert gas, it may be possible to use, for example, a nitrogen ($N_2$) gas. The $N_2$ gas acts as a purge gas or a carrier gas.

A processing gas (precursor gas) supply system and a second cleaning gas supply system are mainly configured by the gas supply pipe 232a, the MFC 241a, and the valve 243a, respectively. A processing gas (a nitriding gas or an oxidizing gas) supply system is mainly configured by the gas supply pipe 232b, the MFC 241b, and the valve 243b. An inert gas supply system is mainly configured by the gas supply pipes 232c and 232d, the MFCs 241c and 241d, and the valves 243c and 243d. In addition, a first cleaning gas supply system is mainly configured by a gas supply pipe 232e, an MFC 241e, and a valve 243e which will be described later.

Any one or all of the various supply systems described above may be configured as integrated supply systems 248 in which the valves 243a to 243e, the MFCs 241a to 241e, or the like are integrated. Each of the integrated supply systems 248 is connected to each of the gas supply pipes 232a to 232e, and is configured such that the supply operation of various kinds of gases into the gas supply pipes 232a to 232e, namely the opening/closing operation of the valves 243a to 243e, the flow rate adjusting operation by the MFCs 241a to 241d or the like, is controlled by a controller 121 which will be described later. The integrated supply system 248 is configured as an integral type or division type integrated unit, and is also configured such that it is detachable from the gas supply pipes 232a to 232e or the like to perform the maintenance, replacement, expansion or the like of the integrated supply system 248, on an integrated unit basis.

An exhaust pipe 231 configured to exhaust an internal atmosphere of the process chamber 201 is connected to the lower side of the sidewall of the reaction tube 203. A vacuum pump 246 as a vacuum exhaust device is connected to the exhaust pipe 231 via a pressure sensor 245 as a pressure detector (pressure detection part) which detects an internal pressure of the process chamber 201 and an auto pressure controller (APC) valve 244 as a pressure regulator (pressure regulation part). The APC valve 244 is configured so that vacuum exhaust of the interior of the process chamber 201 and the vacuum exhaust stop can be performed by opening and closing the APC valve 244 while operating the vacuum pump 246 and so that the internal pressure of the process chamber 201 can be adjusted by adjusting an opening degree of the APC valve 244 based on the pressure information detected by the pressure sensor 245 while operating the vacuum pump 246.

The exhaust pipe 231e, which is at least a portion of the exhaust pipe 231 on the downstream side of the APC valve 244, is configured to be detachable and replaceable. A supply port 231p is installed in the exhaust pipe 231e. The gas supply pipe 232e is connected to the supply port 231p. The MFC 241e and the valve 243e are installed in the gas supply pipe 232e sequentially from the corresponding upstream side. For example, a hydrogen fluoride (HF) gas is supplied as a first cleaning gas from the gas supply pipe 232e into the exhaust pipe 231e and into the vacuum pump 246 via the MFC 241e, the valve 243e, and the supply port 231p.

An exhaust system is mainly configured by the exhaust pipe 231, the APC valve 244, and the pressure sensor 245. Furthermore, an exhaust part is mainly configured by the exhaust pipe 231e and the vacuum pump 246. The supply port 231p may be regarded as being included in the exhaust part. The exhaust part may be regarded as being included in the exhaust system.

A seal cap 219, which serves as a first cover configured to hermetically seal a lower end opening of the manifold 209, namely an opening configured to take in and out the wafers 200, is installed under the manifold 209. The seal cap 219 is made of a metal material such as, e.g., SUS or the like, and is formed in a disc shape. An O-ring 220b, which is a seal member making contact with the lower end portion of the manifold 209, is installed on an upper surface of the seal cap 219. A rotation mechanism 267 configured to rotate a boat 217, which will be described later, is installed below the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism installed outside the reaction tube 203. The boat elevator 115 is configured as a transfer device (transfer mechanism) which loads and unloads (transfers) the wafers 200 into and from the process chamber 201 by moving the seal cap 219 up and down. Furthermore, a shutter 219s as a second cover capable of hermetically seal the lower end opening of the manifold 209, with the boat 217 unloaded from the interior of the process chamber 201 by moving the seal cap 219 down, is installed under the manifold 209. The shutter 219s is made of a metal material such as, e.g., SUS or the like, and is formed in a disc shape. An O-ring 220c as a seal member making contact with the lower end portion of the manifold 209 is installed on an upper surface of the shutter 219s. An opening/closing operation (an up-down movement operation or a rotational movement operation) of the shutter 219s is controlled by a shutter opening/closing mechanism 115s.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 to be spaced apart from each other. The boat 217 is made of a heat resistant material such as quartz or SiC. Heat insulating plates 218 made of a heat resistant material such as quartz or SiC, are installed below the boat 217 in multiple stages.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. The temperature sensor 263 is installed along the inner wall of the reaction tube 203.

Figure 3:
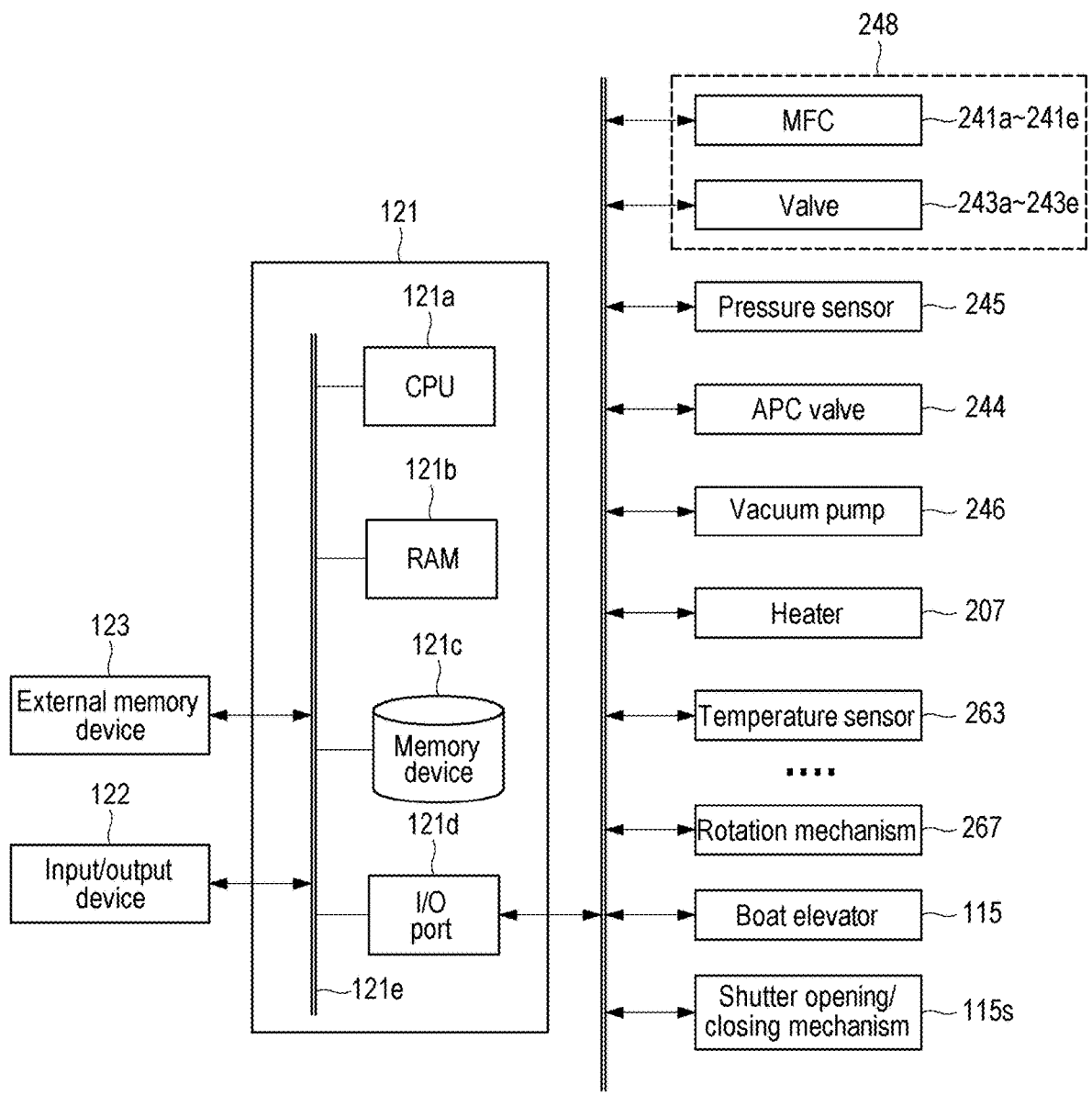
FIG. 3 is a schematic configuration diagram of a controller of the substrate processing apparatus used in one embodiment of the present disclosure, in which a control system of the controller is shown in a block diagram.

As illustrated in FIG. 3, the controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured by, for example, a flash memory, a hard disk drive (HDD), or the like. A control program for controlling operations of a substrate processing apparatus, a process recipe for specifying sequences and conditions of substrate processing as described hereinbelow, a cleaning recipe for specifying sequences and conditions of a cleaning process as described hereinbelow, or the like is readably stored in the memory device 121c. The process recipe and the cleaning recipe function as a program for causing the controller 121 to execute each sequence in the substrate processing and the cleaning process, as described hereinbelow, to obtain a predetermined result, respectively. Hereinafter, the process recipe, the cleaning recipe and the control program will be generally and simply referred to as a "program." Furthermore, the process recipe and the cleaning recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241e, the valves 243a to 243e, the pressure sensor 245, the APC valve 244, the vacuum pump 246, the temperature sensor 263, the heater 207, the rotation mechanism 267, the boat elevator 115, the shutter opening/closing mechanism 115s, and the like, as mentioned above.

The CPU 121a is configured to read the control program from the memory device 121c and execute the same. The CPU 121a also reads the recipe from the memory device 121c according to an input of an operation command from the input/output device 122. In addition, the CPU 121a is configured to control, according to the contents of the recipe thus read, the flow rate adjusting operation of various kinds of gases by the MFCs 241a to 241e, the opening/closing operation of the valves 243a to 243e, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, the operation of opening and closing the shutter 219s with the shutter opening/closing mechanism 115s, and the like.

The controller 121 may be configured by installing, on the computer, the aforementioned program stored in an external memory device 123 (for example, a magnetic disk such as an HDD, an optical disc such as a CD, a magneto-optical disc such as an MO, or a semiconductor memory such as a USB memory). The memory device 121c or the external memory device 123 is configured as a computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using a communication means such as the Internet or a dedicated line, instead of using the external memory device 123.

(2) Substrate Processing

A sequence example of forming a film containing Si, O and N, i.e., a silicon oxynitride film (SiON film), on a wafer 200 as a substrate using the aforementioned substrate processing apparatus, which is one of the processes for manufacturing a semiconductor device, will be described below with reference to FIG. 4. In the following descriptions, the operations of the respective parts constituting the substrate processing apparatus are controlled by the controller 121. This also applies to first and second cleaning processes as described hereinbelow.

In the film forming sequence of the present embodiment, a cycle is performed a predetermined number of times (n times, where n is an integer of 1 or more), the cycle including non-simultaneously performing: a step 1 of supplying an HCDS gas as a processing gas (precursor gas) to a wafer 200 in the process vessel; a step 2 of supplying the NH$_3$ gas as a processing gas (nitriding agent) to the wafer 200 in the process vessel; and a step 3 of supplying the O$_2$ gas as a processing gas (oxidizing agent) to the wafer 200 in the process vessel.

In the present disclosure, for the sake of convenience, the aforementioned film forming sequence may sometimes be denoted as follows. The same denotation will be used in the modifications and the like as described hereinbelow.

(HCDS→NH$_3$→O$_2$)×n⇒SiON

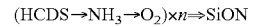

When the term "wafer" is used herein, it may refer to "a wafer itself" or "a laminated body of a wafer and a predetermined layer or film formed on the surface of the wafer". When the phrase "a surface of a wafer" is used herein, it may refer to "a surface of a wafer itself" or "a surface of a predetermined layer formed on a wafer. In the present disclosure, the expression "a predetermined layer is formed on a wafer" may mean that "a predetermined layer is directly formed on a surface of a wafer itself" or that "a predetermined layer is formed on a layer formed on a wafer. In addition, when the term "substrate" is used herein, it may be synonymous with the term "wafer."

(Wafer Charging to Boat Loading)

If a plurality of wafers 200 is charged on the boat 217 (wafer charging), the shutter 219s is moved by the shutter opening/closing mechanism 115s to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 through the O-ring 220b.

(Pressure Regulation and Temperature Adjustment)

The interior of the process chamber 201, namely the space in which the wafers 200 are located, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. Furthermore, the wafers 200 in the process chamber 201 are heated by the heater 207 to a desired processing temperature. In this operation, the state of supplying electric power to the heater 207 is feedback-controlled based on the temperature information detected by the temperature sensor 263 such that the interior of the process chamber 201 has a desired temperature distribution. In addition, the rotation of the wafers 200 by the rotation mechanism 267 begins. The operation of the vacuum pump 246 and the heating and rotation of the wafers 200 may be all continuously performed at least until the processing of the wafers 200 is completed.

(Film Forming Process)

Thereafter, the following steps 1 to 3 are sequentially performed.

[Step 1]

At this step, an HCDS gas is supplied to the wafer 200 in the process chamber 201.

Specifically, the valve 243a is opened to allow an HCDS gas to flow through the gas supply pipe 232a. A flow rate of the HCDS gas is adjusted by the MFC 241a. The HCDS gas is supplied into the process chamber 201 via the nozzle 249a and is exhausted from the exhaust pipe 231. At this time, the HCDS gas is supplied to the wafer 200. Simultaneously, the valves 243c and 243d may be opened to allow an $N_2$ gas to flow through the gas supply pipes 232c and 232d.

The processing conditions at this step may be exemplified as follows:

HCDS gas supply flow rate: 1 to 2,000 sccm or 10 to 1,000 sccm in some embodiments $N_2$ gas supply flow rate (per gas supply pipe): 0 to 10,000 sccm Each gas supply time period: 1 to 120 seconds or 1 to 60 seconds in some embodiments Processing temperature: 250 to 800 degrees C. or 400 to 700 degrees C. in some embodiments Processing pressure: 1 to 2,666 Pa or 67 to 1,333 Pa in some embodiments.

By supplying the HCDS gas to the wafer 200 under the aforementioned conditions, an Si-containing layer containing Cl is formed as a first layer on the outermost surface of the wafer 200. The Si-containing layer containing Cl is formed on the outermost surface of the wafer 200 by physisorption of HCDS, chemisorption of a substance decomposed in a portion of HCDS (hereinafter, referred to as $Si_xCl_y$), thermal decomposition of HCDS, or the like. The Si-containing layer containing Cl may be an adsorption layer (a physisorption layer or a chemisorption layer) of HCDS or $Si_xCl_y$, or may be an Si layer containing Cl. Furthermore, in the present disclosure, the Si-containing layer containing Cl may be simply referred to as an Si-containing layer.

After the first layer is formed on the wafer 200, the valve 243a is closed to stop supplying the HCDS gas into the process chamber 201. Then, the interior of the process chamber 201 is vacuum-exhausted and the gas or the like remaining within the process chamber 201 is removed from the interior of the process chamber 201. At this time, the valves 243c and 243d are opened to supply an $N_2$ gas into the process chamber 201. The $N_2$ gas acts as a purge gas.

As the precursor gas (Si-containing gas), it may be possible to use, in addition to the HCDS gas, a chlorosilane gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, an octachlorotrisilane ($Si_3Cl_8$, abbreviation: OCTS) gas or the like. Furthermore, as the precursor gas, it may be possible to use a tetrafluorosilane ($SiF_4$) gas, a tetrabromosilane ($SiBr_4$) gas, a tetraiodosilane ($SiI_4$) gas or the like. That is, as the precursor gases, it may be possible to use various kinds of halosilane gases such as a chlorosilane gas, a fluorosilane gas, a bromosilane gas, an iodosilane gas and the like.

In addition, as the precursor gas (Si-containing gas), it may be possible to use various kinds of aminosilane gases such as a bis-diethylaminosilane ($SiH_2[N(C_2H_5)_2]_2$, abbreviation: BDEAS) gas, a bis-tertiary-butylaminosilane ($SiH_2[NH(C_4H_9)]_2$, abbreviation: BTBAS) gas, a tris-diethylaminosilane ($SiH[N(C_2H_5)_2]_3$, abbreviation: 3DEAS) gas, a tris-dimethylaminosilane ($SiH[N(CH_3)_2]_3$, abbreviation: 3DMAS) gas, a tetrakis-diethylaminosilane ($Si[N(C_2H_5)_2]_4$, abbreviation: 4DEAS) gas, a tetrakis-dimethylaminosilane ($Si[N(CH_3)_2]_4$, abbreviation: 4DMAS) gas and the like.

As the purge gas, it may be possible to use, in addition to the $N_2$ gas, for example, various kinds of rare gases such as an Ar gas, an He gas, an Ne gas, a Xe gas and the like. This also applies to steps 2 and 3 as described hereinbelow.

[Step 2]

After step 1 is completed, the $NH_3$ gas is supplied to the wafer 200 in the process chamber 201, namely the first layer formed on the wafer 200.

Specifically, the opening/closing control of the valves 243b to 243d is performed in the same procedure as the opening/closing control of the valves 243a, 243c and 243d at step 1. The flow rate of the $NH_3$ gas is adjusted by the MFC 241b. The $NH_3$ gas is supplied into the process chamber 201 via the nozzle 249b and is exhausted from the exhaust pipe 231. At this time, the $NH_3$ gas is supplied to the wafer 200.

The processing conditions at this step may be exemplified as follows:

$NH_3$ gas supply flow rate: 100 to 10,000 sccm

Processing pressure: 1 to 4,000 Pa or 1 to 3,000 Pa in some embodiments.

Other processing conditions may be similar to the processing conditions of step 1.

By supplying the $NH_3$ gas to the wafer 200 under the aforementioned conditions, at least a portion of the first layer formed on the wafer 200 at step 1 can be modified (nitrided). This makes it possible to desorb Cl from the first layer and to introduce the N components contained in the $NH_3$ gas into the first layer. By modifying the first layer in this manner, a silicon nitride layer (SiN layer) which is a layer containing Si and N is formed as a second layer on the wafer 200.

After the second layer is formed on the wafer 200, the valve 243b is closed to stop supplying the $NH_3$ gas into the process chamber 201. Then, the gas or the like remaining within the process chamber 201 are removed from the interior of the process chamber 201 according to the same processing procedures as those of step 1.

As the nitriding agent, it may be possible to use, in addition to the $NH_3$ gas, a diazene ($N_2H_2$) gas, a hydrazine ($N_2H_4$) gas, an $N_3H_8$ gas, a gas containing these compounds or the like.

[Step 3]

After step 2 is completed, the $O_2$ gas is supplied to the wafer 200 in the process chamber 201, namely the second layer formed on the wafer 200.

Specifically, the opening/closing control of the valves 243b to 243d is performed in the same procedure as the opening/closing control of the valves 243a, 243c and 243d at step 1. The flow rate of the $O_2$ gas is adjusted by the MFC 241b. The $O_2$ gas is supplied into the process chamber 201 via the nozzle 249b and is exhausted from the exhaust pipe 231. At this time, the $O_2$ gas is supplied to the wafer 200.

The processing conditions at this step may be exemplified as follows:

$O_2$ gas supply flow rate: 100 to 10,000 sccm

Processing pressure: 1 to 4,000 Pa or 1 to 3,000 Pa in some embodiments.

Other processing conditions may be similar to the processing conditions of step 1.

By supplying the $O_2$ gas to the wafer 200 under the aforementioned conditions, at least a portion of the second layer formed on the wafer 200 at step 2 can be modified (oxidized). This makes it possible to desorb Cl from the second layer and to introduce the O components contained in the $O_2$ gas into the second layer. By modifying the second layer in this manner, a silicon oxynitride layer (SiON layer) which is a layer containing Si, O and N is formed as a third layer on the wafer 200.

After the third layer is formed on the wafer 200, the valve 243b is closed to stop supplying the $O_2$ gas into the process chamber 201. Then, the gas or the like remaining within the process chamber 201 is removed from the interior of the process chamber 201 according to the same processing procedure as that of step 1.

As the oxidizing agent, it may be possible to use, in addition to the $O_2$ gas, a nitrous oxide ($N_2O$) gas, a nitric oxide (NO) gas, a nitrogen dioxide ($NO_2$) gas, an ozone ($O_3$) gas, a hydrogen peroxide ($H_2O_2$) gas, water vapor ($H_2O$ gas), a carbon monoxide (CO) gas, a carbon dioxide ($CO_2$) gas or the like.

[Performing a Predetermined Number of Times]

A cycle which non-simultaneously, i.e., non-synchronously, performs steps 1 to 3 is implemented a predetermined number of times (n times, where n is an integer of 1 or more). Thus, an SiON film having a predetermined composition and a predetermined thickness can be formed on the wafer 200. The aforementioned cycle may be repeated multiple times. That is, the thickness of the third layer formed per one cycle may be set smaller than a desired thickness and the aforementioned cycle may be repeated multiple times until the thickness of the film formed by laminating the third layer becomes equal to the desired thickness.

(After-Purge and Atmospheric Pressure Return)

After the film forming process is completed, the $N_2$ gas is supplied from each of the gas supply pipes 232c and 232d into the process chamber 201 and is exhausted from the exhaust pipe 231. Thus, the interior of the process chamber 201 is purged, and the gas, the reaction byproduct or the like, which remains within the process chamber 201, is removed from the interior of the process chamber 201 (after-purge). The internal atmosphere of the process chamber 201 is substituted by an inert gas (inert gas substitution), and then, the APC valve 244 is fully closed (full closing). Thereafter, the internal pressure of the process chamber 201 is returned to an atmospheric pressure by continuing to supply the $N_2$ gas into the process chamber 201 (atmospheric pressure return).

(Boat Unloading and Wafer Discharging)

Thereafter, the seal cap 219 is moved down by the boat elevator 115 to open the lower end of the manifold 209. Then, the processed wafers 200 supported on the boat 217 are unloaded from the lower end of the manifold 209 to the outside of the reaction tube 203 (boat unloading). After the boat unloading, the shutter 219s is moved so that the lower end opening of the manifold 209 is sealed by the shutter 219s through the O ring 220c (shutter closing). The processed wafers 200 are unloaded to the outside of the reaction tube 203 and are subsequently discharged from the boat 217 (wafer discharging).

(3) First Cleaning Process

When the aforementioned substrate processing (batch processing), i.e., the film forming process, is performed, the byproduct containing silicon oxide ($SiO_x$) or the like can adhere to the interior of the exhaust part. That is, the byproduct containing $SiO_x$ or the like adheres to the inner wall of the exhaust pipe 231e, the surfaces of members in the vacuum pump 246 or the like. The temperature of the exhaust pipe 231e or the vacuum pump 241 is lower than the temperature of the exhaust pipe 231 at the upstream side of the process vessel or the APC valve 244 during the execution of the film forming process. Therefore, a large amount of byproduct tends to adhere to the interior of the exhaust part, compared with the interior of the process vessel or the interior of the exhaust pipe 231 at the upstream side of the APC valve 244.

When the batch processing is repeatedly performed on the byproduct adhered to the interior of the exhaust part, the byproduct may be fixed depending on the number of times of batch processing. The fixed byproduct tends to be hardly etched even though a cleaning gas such as an HF gas is supplied into the exhaust part, making it difficult to remove the byproduct from the interior of the exhaust part. Therefore, in the present embodiment, the interior of the exhaust part is cleaned by supplying the HF gas directly into the exhaust part, without passing the interior of the process vessel, each time the aforementioned film forming process is carried out several batches or one batch in some embodiments, namely before the byproduct is fixed inside the exhaust part. The phrase "the number of times of batch processing" may refer to the number of times the substrate processing is performed from the wafer charging to the wafer discharging.

When cleaning the interior of the exhaust part, the valve 243e is opened, with the APC valve 244 fully closed, to allow the HF gas as the first cleaning gas to flow through the gas supply pipe 232e. The flow rate of the HF gas is adjusted by the MFC 241e. The HF gas is supplied into the exhaust pipe 231e and the vacuum pump 246 via the supply port 231p to make contact with the inner wall of the exhaust pipe 231e, the surfaces of the members in the vacuum pump 246, or the like. At this time, a thermochemical reaction (etching reaction) occurs between the HF gas and the byproduct to remove the byproduct from the interior of the exhaust part. During this process, the vacuum pump 246 may be stopped or operated.

In the present disclosure, this process performed on the interior of the exhaust part will be referred to as a "first cleaning process." A frequency of performing the first cleaning process is set higher than a frequency of performing a second cleaning process which will be described later. For example, the frequency of performing the first cleaning process is set to every several batches one batch in some embodiments, as described above, and the frequency of performing the second cleaning process is set to every 300 to 500 batches. By performing the first cleaning process at such a high frequency, it is possible to etch the byproduct adhered to the interior of the exhaust part in a poor state before it is fixed inside the exhaust part. Furthermore, it is possible to easily and reliably, i.e., efficiently and effectively, remove the byproduct adhered to the interior of the exhaust part from the interior of the exhaust part. As a result, it becomes possible to reduce a frequency of performing the maintenance work of the exhaust part, for example, a frequency of performing a maintenance work such as replacement, cleaning, or overhaul of the exhaust pipe 231e or the vacuum pump 246. The frequency of replacing the vacuum pump 246 may be set to a frequency, for example, every 2,000 to 2,500 batches, lower than the frequency of performing the second cleaning process (every 300 to 500 batches). Since an internal clearance of the exhaust pipe 231e is larger than that of the vacuum pump 246, the frequency of replacing the exhaust pipe 231e may be set equal to or less than the frequency of replacing the vacuum pump 246 as described above.

The first cleaning process may be performed during a period from the completion of the film forming process to the start of a subsequent film forming process. That is, the first cleaning process may be performed during the execution period of the batch processing. As described above, by promptly performing the first cleaning process after the completion of the film forming process and before the byproduct adhered to the interior of the exhaust part is fixed, it becomes to more reliably remove the byproduct from the interior of the exhaust part.

The first cleaning process may be performed in a state in which the wafers 200 are accommodated within the process vessel. Specifically, the first cleaning process may be performed during a period after the accommodation of the wafers 200 within the process vessel before the start of the film forming process (a period after the loading before the film formation). The first cleaning process may also be performed during a period after the completion of the film forming process before the unloading of the wafers 200 subjected to the film forming process from the process vessel (a period after the film formation before the unloading). In particular, in the latter case, since the byproduct can be etched in a poorer state of the byproduct adhered to the interior of the exhaust part, it is possible to more reliably prevent fixation of the byproduct adhered to the interior of the exhaust part and to more reliably remove the byproduct from the interior of the exhaust part. Furthermore, in the case where the first cleaning process is performed with the wafers 200 accommodated within the process vessel, this process may be performed with the lower end opening of the manifold 209 sealed by the seal cap 219.

In addition, after the film forming process is completed, the first cleaning process may be performed in a state after the wafers 200 subjected to the film forming process is unloaded from the interior of the process vessel, namely in a state in which the wafers 200 are not accommodated within the process vessel. Specifically, the first cleaning process may also be performed during a period after the unloading of the wafers 200 subjected to the film forming process from the interior of the process vessel before the accommodation of the wafers 200 to be processed in a subsequent film forming process within the process vessel (a period after the unloading before the loading). In the case where the first cleaning process is performed during the period after the unloading before the loading, it is possible to effectively utilize a standby period between the film forming processes (for example, a period required for the wafer discharging and wafer charging). Furthermore, in the case where the first cleaning process is performed with the wafers 200 not accommodated within the process vessel, this process may be performed with the lower end opening of the manifold 209 sealed by the shutter 219s.

As described above, the first cleaning process may be performed in either of the state in which the wafers 200 are accommodated within the process vessel and the state in which the wafers 200 are not accommodated within the process vessel. In either case, the first cleaning process is performed in a state in which the lower end opening of the manifold 209 is not opened but sealed by the cover such as the seal cap 219 and the shutter 219s. In addition, in either case, the first cleaning process is performed in a state in which the exhaust valve, namely the APC valve 244, installed in the exhaust pipe 231e at the upstream side of the portion where the supply port 231p is installed in the exhaust pipe 231e is fully closed. By performing the first cleaning process with the APC valve 244 fully closed, it is possible to prevent backflow of the HF gas supplied into the exhaust part into the process vessel. Furthermore, by performing the first cleaning process with the lower end opening of the manifold 209 sealed, it is possible to prevent release (leakage) of the HF gas to the outside of the process vessel even if the HF gas supplied into the exhaust part flows back into the process vessel. As described above, by doubly performing the opening/closing control (safety control) of each of the lower end opening of the manifold 209 and the APC valve 244, it is possible to enhance the safety of the first cleaning process.

Figure 4:
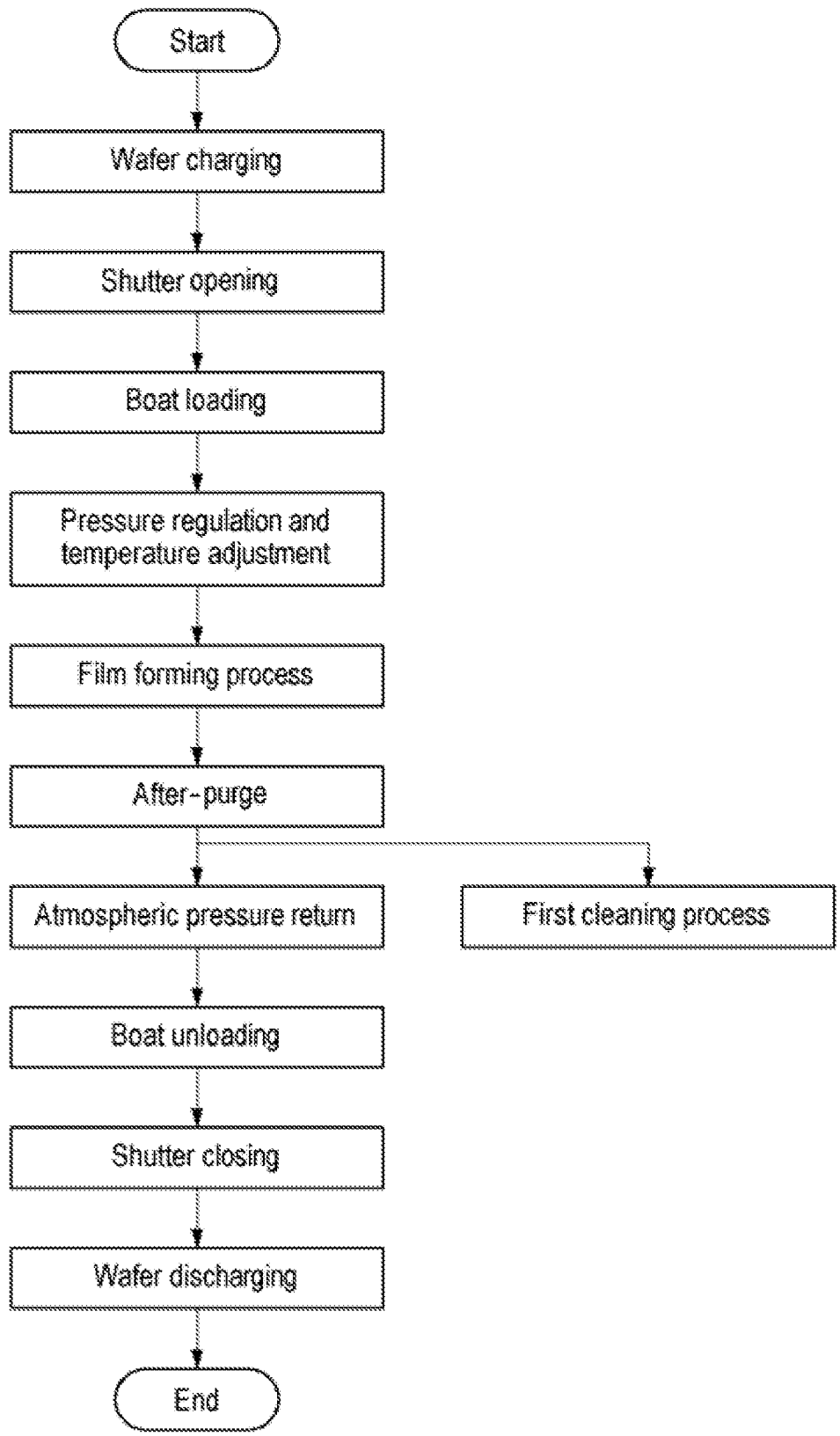
FIG. 4 is a diagram illustrating a substrate processing sequence according to one embodiment of the present disclosure.

As illustrated in FIG. 4, in the substrate processing sequence according to the present embodiment, the first cleaning process is started after the completion of the after-purge described above and is completed before the start of the boat unloading. That is, the first cleaning process is performed in parallel with the atmospheric pressure return. In this case, since the first cleaning process is promptly started after the completion of the film forming process, it is possible to easily and reliably remove the byproduct from the interior of the exhaust part. Furthermore, at the timing of starting the first cleaning process, namely at the time of starting the atmospheric pressure return, since the APC valve 244 is fully closed as described above and the lower end opening of the manifold 219 is sealed, it is also possible to safely proceed with the first cleaning process.

The processing conditions at this step may be exemplified as follows:

HF gas supply flow rate: 4,000 to 6,000 sccm
Gas supply time period: 3 to 10 minutes
Internal temperature of the exhaust part: 50 to 100 degrees C.
Internal pressure of the exhaust part: 1,330 Pa (10 Torr) to 101,300 Pa (atmospheric pressure).

(4) Second Cleaning Process

When the aforementioned substrate processing (batch processing), i.e., the film forming process, is repeatedly performed, deposits including a thin film such as an SiON film or the like are accumulated within the process vessel, for example, the inner wall of the reaction tube 203, the surfaces of the nozzles 249a and 249b, the surface of the boat 217 or the like. That is, the deposits including this thin film adhere to the surfaces of members in the heated process chamber 201 and are accumulated. When the amount of these deposits, i.e., the cumulative film thickness, reaches a predetermined amount (thickness) before delamination or falling of the deposits, the interior of the process vessel is cleaned. In the present disclosure, this process performed on the process vessel will be referred to as a "second cleaning process." The second cleaning process is performed, for example, every 300 to 500 batches, and the frequency thereof is set lower than the frequency (every several batches or every one batch in some embodiments) of performing the aforementioned first cleaning process. The frequency of performing the second cleaning process is higher than the frequency (every 2,000 to 2,500 batches) at which the maintenance work of the exhaust part described above is performed. Hereinafter, an example of the second cleaning process according to the present embodiment will be described.

(Boat Loading)

After the aforementioned batch processing, i.e., the substrate processing from the wafer charging to the wafer discharging, is performed, for example, 300 to 500 times, the shutter 219s is moved by the shutter opening/closing mechanism 115s to open the lower end opening of the manifold 209 (shutter opening). Thereafter, the empty boat 217 not charged with the wafers 200 is lifted up by the boat elevator 115 and is loaded into the process chamber 201. In this state, the seal cap 219 seals the lower end of the manifold 209 through the O-ring 220b.

(Pressure Regulation and Temperature Adjustment)

The interior of the process chamber 201 is vacuum-exhausted by the vacuum pump 246 so as to reach a desired pressure. The vacuum pump 246 may be always activated at least until the second cleaning process is completed. Furthermore, the interior of the process chamber 201 is heated by the heater 207 so as to reach a predetermined temperature. The rotation of the boat 217 by the rotation mechanism 267 begins. The heating of the interior of the process chamber 201 by the heater 207 and the rotation of the boat 217 may be continuously performed at least until a cleaning step as described hereinbelow is completed. However, it is not necessary to rotate the boat 217.

(Cleaning Step)

Subsequently, an $F_2$ gas as a second cleaning gas is supplied into the process vessel after repeatedly performing the aforementioned film forming process. At this step, the opening/closing control of the valves 243a, 243c and 243d, with the valve 243b closed, is performed in the same procedure as the opening/closing control of the valves 243a, 243c and 243d at step 1 of the film forming process. The flow rate of the $F_2$ gas is adjusted by the MFC 241a. The $F_2$ gas is supplied into the process chamber 201 via the gas supply pipe 232a and the nozzle 249a.

When the $F_2$ gas supplied into the process chamber 201, which passes the interior of the process chamber 201, is exhausted from the exhaust pipe 231, it makes contact with the surfaces of the members in the process chamber 201, for example, the inner wall of the reaction tube 203, the surfaces of the nozzles 249a and 249b, the surface of the boat 217, the inner wall of the manifold 209, the upper surface of the seal cap 219, and the like. At this time, a thermochemical reaction (etching reaction) occurs between the $F_2$ gas and the deposits, and as a result, the deposits are removed from the interior of the process chamber 201.

The processing conditions at this step may be exemplified as follows:

$F_2$ gas supply flow rate: 4,000 to 6,000 sccm
Gas supply time period: 30 to 40 hours
Processing temperature: 350 to 450 degrees C.
Processing pressure: 1,330 Pa (10 Torr) to 101,300 Pa (atmospheric pressure).

As the second cleaning gas, it may be possible to use, in addition to the $F_2$ gas, a chlorine fluoride ($ClF_3$) gas, a nitrogen fluoride ($NF_3$) gas, an HF gas or the like.

(After-Purge and Atmospheric Pressure Return Step)

After the cleaning step is completed, the valve 243a is closed to stop supplying the $F_2$ gas into the process chamber 201. Then, the interior of the process chamber 201 is purged in the same processing procedure as the after-purge of the film forming process (after-purge). At this time, the purge operation of the interior of the process chamber 201 may be intermittently performed by repeating the opening/closing operation of the valves 243c and 243d (cycle purge). Thereafter, the internal atmosphere of the process chamber 201 is substituted by an $N_2$ gas (inert gas substitution), and the internal pressure of the process chamber 201 is returned to an atmospheric pressure (atmospheric pressure return).

(Boat Unloading)

Thereafter, the seal cap 219 is moved down by the boat elevator 115 to open the lower end of the manifold 209, and the empty boat 217 is unloaded from the lower end of the manifold 209 to the outside of the reaction tube 203 (boat unloading). After the boat unloading, the shutter 219s is moved so that the lower end opening of the manifold 209 is sealed by the shutter 219s through the O-ring 220c. Upon completion of a series of these steps, the film forming process described above is restarted.

(5) Effects according to the Present Embodiment

According to the present embodiment, one or more effects as set forth below may be achieved.

(a) By setting the frequency of performing the first cleaning process higher than the frequency of performing the second cleaning process, it is possible to etch the byproduct adhered to the interior of the exhaust part in a poor state before the byproduct is permanently fixed. Furthermore, it is possible to easily and reliably remove the byproduct adhered to the interior of the exhaust part from the interior of the exhaust part. As a result, it is possible to reduce the maintenance frequency of the exhaust part. For example, the frequency of replacing the vacuum pump 246 or the exhaust pipe 231e may set to be lower than the frequency of performing the second cleaning process.

FIG. 5A is a diagram illustrating an example of the maintenance frequency of the exhaust part when the first cleaning process is not performed. FIG. 5B is a diagram illustrating an example of the maintenance frequency of the exhaust part when the first cleaning process is performed every one batch. In these drawings, "numeric value-numerical value" indicates the number of times of performing batch processing (the number of times at the start time–the number of times at the stop time), "C" indicates the second cleaning process performed for predetermined batch, here, every 500 batches, "E" indicates the first cleaning process performed every one batch, and "P" indicates the maintenance work of the exhaust part (pump replacement operation and exhaust pipe replacement operation).

As described above, since the first cleaning process can be performed during the execution period of the batch processing (for example, in parallel with the atmospheric pressure return), the time period of the first cleaning process performed every one batch is expressed as being equal to the time period of the batch processing in FIG. 5B for the sake of convenience. Furthermore, as described above, the exhaust pipe replacement frequency may be set equal to or less than the pump replacement frequency, but an example in which the frequencies of both are set equal to each other is illustrated here. Both FIGS. 5A and 5B show the maintenance frequency of the exhaust part after the execution of the batch processing at first batch before the execution of the batch processing at 2001th batch.

According to these drawings, it can be seen that the maintenance frequency (1 time/2,000 batches) of the exhaust part when the first cleaning process is performed is lower than the maintenance frequency of the exhaust part (1 time/300 batches) when the first cleaning process is not performed. In the example shown in FIG. 5B, the maintenance of the exhaust part can be reduced by five times as compared with the example shown in FIG. 5A. Since it takes about 10 to 15 hours for one pump replacement, it is possible to shorten the downtime of the substrate processing apparatus and to increase its operation efficiency by reducing the maintenance frequency of the exhaust part as described above.

(b) By performing the first cleaning process every several batches or one batch in some embodiments, during a period after the completion of the film forming process before the start of the subsequent film forming process, the aforementioned effects can be achieved more reliably.

(c) By performing the first cleaning process every several batches or every batch in some embodiments, during a period after the completion of the film forming process before the unloading of the wafers 200 subjected to the film forming process from the interior of the process vessel, the aforementioned effects can be achieved more certainly.

(d) By performing the first cleaning process with the APC valve 244 fully closed and the lower end opening of the manifold 209 sealed, it is possible to reliably prevent leakage of the HF gas to the outside of the process vessel. This makes it possible to enhance the safety of the first cleaning process.

(e) These effects can be similarly achieved in the case where an Si-containing gas other than the HCDS gas is used as the precursor gas, or in the case where an N-containing gas other than the $NH_3$ gas is used as the nitriding agent, or in the case where an O-containing gas other than the $O_2$ gas is used as the oxidizing agent. Furthermore, the same effects can be achieved in the case where a gas other than the HF gas is used as the first cleaning gas or in the case where a gas other than the $F_2$ gas is used as the second cleaning gas.

Other Embodiments

While one embodiment of the present disclosure has been specifically described above, the present disclosure is not limited to the aforementioned embodiment but may be differently modified without departing from the spirit of the present disclosure.

For example, the sequence of the film forming process is not limited to the form of the aforementioned embodiment. For example, even in the case of forming a silicon oxide film (SiO film), a silicon oxycarbonitride film (SiOCN film), a silicon oxycarbide film (SiOC film) or the like on the wafers 200 by the film forming sequences denoted below, the same effects as those of the aforementioned embodiment may be achieved by performing the aforementioned first cleaning process at the aforementioned frequency.

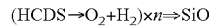

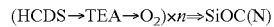

Furthermore, in the case where the aforementioned film forming process is performed to manufacture a 3D device such as a 3D NAND, it tends to lengthen a supply time period of a precursor gas such as an HCDS gas or increase a supply amount thereof. In this case, the amount of the byproduct adhered to the interior of the exhaust part tends to increase, thereby increasing the maintenance frequency of the exhaust part. In response to such a problem, the present disclosure can significantly reduce the maintenance frequency of the exhaust part.

In the aforementioned embodiment, there has been described an example in which the byproduct adhered to the interior of the exhaust part mainly contains SiOx, but the byproduct to be cleaned by the first cleaning process of the present disclosure are not limited to such substances. For example, even in the case where the byproduct adhered to the interior of the exhaust part contains substances such as ammonium chloride ($NH_4ClO_x$) containing O or ammonium chloride ($NH_4Cl$), the same effects as those of the aforementioned embodiment may be achieved by performing the aforementioned first cleaning process at the aforementioned frequency.

In the aforementioned embodiment, there has been described an example in which the exhaust pipe 231e and the vacuum pump 246 are mainly cleaned in the first cleaning process, but the members to be cleaned by the first cleaning process are not limited thereto. For example, even for the byproduct adhered to the interior of an exhaust duct (a duct connecting a harm-removing device (not shown) and the vacuum pump 246) installed at the downstream side of the vacuum pump 246, it is also possible to efficiently remove it by performing the aforementioned first cleaning process at the aforementioned frequency.

Recipes used in substrate processing or the cleaning process may be prepared individually according to the processing contents and may be stored in the memory device 121c via a telecommunication line or the external memory device 123. Moreover, at the start of the substrate processing or the cleaning process, the CPU 121a may properly select an appropriate recipe from among the plurality of recipes stored in the memory device 121c according to the contents of the substrate processing or the cleaning process. Thus, it is possible for a single substrate processing apparatus to form films of different kinds, composition ratios, qualities and thicknesses with enhanced reproducibility, and to perform an appropriate cleaning process according to deposits including various films adhered to the interior of the process chamber 201 and the interior of the exhaust part. In addition, it is possible to reduce an operator's burden and to quickly start the processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiment, there has been described an example in which films are formed using a batch-type substrate processing apparatus capable of processing a plurality of substrates at a time. The present disclosure is not limited to the aforementioned embodiment but may be appropriately applied to, e.g., a case where films are formed using a single-wafer-type substrate processing apparatus capable of processing a single substrate or several substrates at a time. In addition, in the aforementioned embodiment, there has been described an example in which films are formed using a substrate processing apparatus provided with a hot-wall-type processing furnace. The present disclosure is not limited to the aforementioned embodiment but may be appropriately applied to a case where films are formed using a substrate processing apparatus provided with a cold-wall-type processing furnace.

In the case of using these substrate processing apparatuses, a film forming process may be performed by the processing procedures and processing conditions similar to those of the embodiment and modifications described above. Effects similar to those of the embodiment and modifications described above may be achieved.

The embodiment and modifications described above may be appropriately combined with one another. In addition, the processing procedures and processing conditions used at this time may be similar to, for example, the processing procedures and processing conditions of the aforementioned embodiment.

EXAMPLES

Hereinafter, examples will be described below.

In an example, an SiON film having a thickness within the range of 3 to 10 nm was formed on a plurality of wafers according to the same processing procedure as the film forming process of the aforementioned embodiment using the substrate processing apparatus illustrated in FIG. 1. When the film forming process is performed in one batch, the interior of the exhaust part was cleaned at the same start timing and according to the same processing procedure as in the first cleaning process of the aforementioned embodiment prior to unloading the wafers from the interior of the process vessel. The processing conditions in the film forming process and the first cleaning process are set to predetermined conditions within the respective processing condition ranges in the aforementioned embodiment. When performing the first cleaning process, the state of reaction between the byproduct adhered to the interior of the exhaust part and the HF gas supplied into the exhaust part was observed using an FTIR analyzer installed in the exhaust part.

Figure 6:
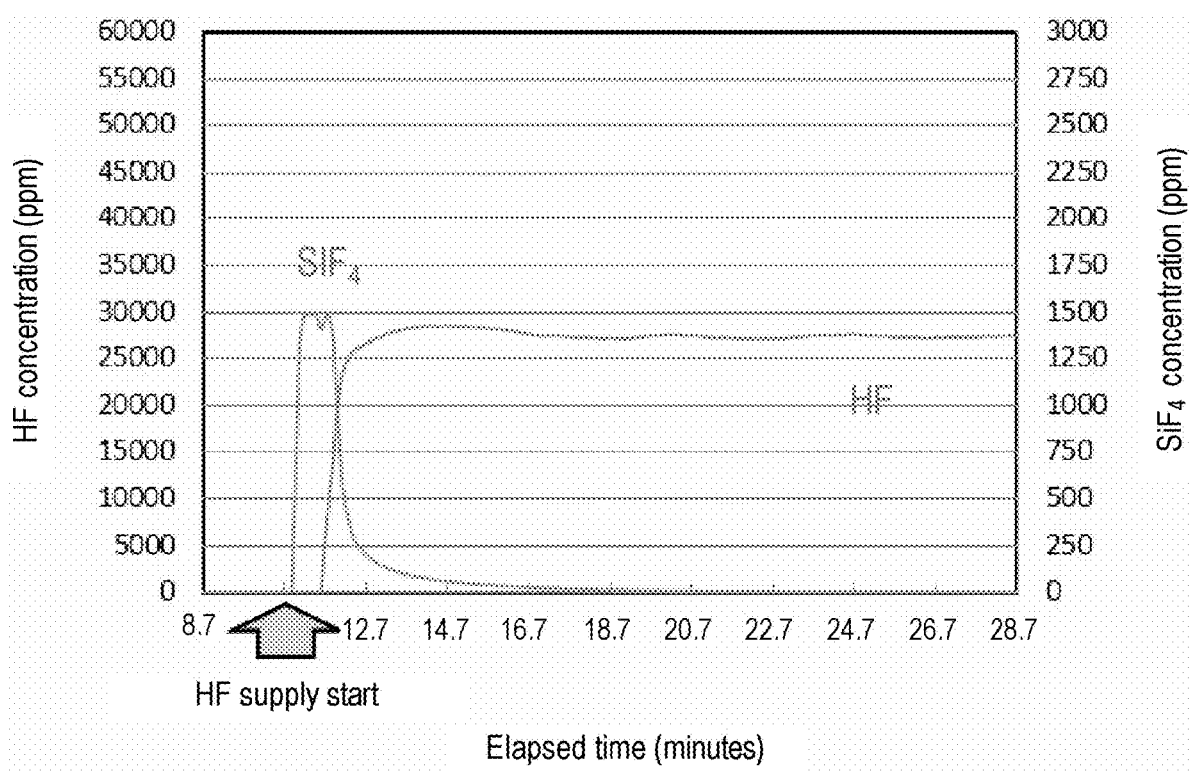
FIG. 6 is a view illustrating a state of reaction between a byproduct adhered to the interior of the exhaust part and an HF gas supplied into the exhaust part.

FIG. 6 shows observation results by the FTIR analyzer. The horizontal axis in FIG. 6 indicates an elapsed time (minutes) after the observation start, the vertical axis (left side) in FIG. 6 indicates a concentration (ppm) of HF in the exhaust part, and the vertical axis (right side) in FIG. 6 indicates a concentration (ppm) of $SiF_4$ generated by reaction between a byproduct and an HF gas in the exhaust part.

According to FIG. 6, it can be seen that, after the start of the supply of the HF gas into the exhaust part, the reaction between the byproduct and the HF gas starts (the concentration of $SiF_4$ increases), and the reaction converges when about 4 to 5 minutes elapse (the concentration of $SiF_4$ decreases). That is, it can be seen that, when the first cleaning process is performed each time the aforementioned film forming process is performed in one batch, the cleaning of the interior of the exhaust part is completed within a short time of about 4 to 5 minutes. In other words, it can be understood that the first cleaning process can be completed at a timing within the time (for example, about 30 minutes) required for the atmospheric pressure return in the process vessel. That is, it is possible to prevent an increase in the total time required for substrate processing, and to avoid a reduction in the productivity of substrate processing.

According to the present disclosure in some embodiments, it is possible to reduce a maintenance frequency of an exhaust part.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    processing a substrate in a process vessel by supplying a processing gas to the substrate and exhausting the processing gas from an exhaust part including an exhaust pipe and a pump;
    cleaning an interior of the exhaust part by supplying a first cleaning gas from a supply port installed at a first portion in the exhaust pipe directly into the exhaust pipe; and
    cleaning an interior of the process vessel by supplying a second cleaning gas into the process vessel,
    wherein a frequency of performing the act of cleaning the interior of the exhaust part is set higher than a frequency of performing the act of cleaning the interior of the process vessel, and
    wherein the act of cleaning the interior of the exhaust part is performed in a state in which an opening configured to take the substrate into and out of the process vessel is not opened but sealed and in a state in which an exhaust valve, which is installed at a second portion in the exhaust pipe at a more upstream side than the first portion in an exhausting direction in the exhaust pipe and configured to open or close the exhaust pipe, is fully closed to prevent the first cleaning gas from being supplied into the process vessel from the supply port.

2. The method of claim 1, further comprising replacing the pump,
    wherein a frequency of performing the act of replacing the pump is set lower than the frequency of performing the act of cleaning the interior of the process vessel.

3. The method of claim 1, further comprising replacing the exhaust pipe,
    wherein a frequency of performing the act of replacing the exhaust pipe is set lower than the frequency of performing the act of cleaning the interior of the process vessel.

4. The method of claim 1, further comprising replacing the pump and replacing the exhaust pipe,
    wherein a frequency of performing the act of replacing the exhaust pipe is set equal to or lower than a frequency of performing the act of replacing the pump.

5. The method of claim 1, wherein the act of cleaning the interior of the exhaust part is performed each time the act of processing the substrate is performed once, and
the act of cleaning the interior of the process vessel is performed each time the act of processing the substrate is performed multiple times.

6. The method of claim 1, wherein the act of cleaning the interior of the exhaust part is performed during a period after a completion of the act of processing the substrate before a start of a subsequent substrate processing.

7. The method of claim 1, wherein the act of cleaning the interior of the exhaust part is performed in a state in which the substrate is accommodated within the process vessel.

8. The method of claim 1, wherein the act of cleaning the interior of the exhaust part is performed after the act of processing the substrate is completed and before the processed substrate is unloaded from the interior of the process vessel.

9. The method of claim 1, wherein the act of cleaning the interior of the process vessel is performed after the act of processing the substrate is completed and after the processed substrate is unloaded from interior the process vessel.

10. The method of claim 1, wherein the first cleaning gas includes a hydrogen fluoride gas and the second cleaning gas includes a fluorine gas, a chlorine fluoride gas, a nitrogen fluoride gas, or the hydrogen fluoride gas.

11. The method of claim 1, wherein in the act of processing the substrate, a film containing at least silicon and oxygen is formed on the substrate.

12. A substrate processing apparatus, comprising:
a process vessel in which a substrate is processed;
a processing gas supply system configured to supply a processing gas to the substrate in the process vessel;
an exhaust part including an exhaust pipe and a pump, and configured to exhaust the processing gas supplied into the process vessel;
a first cleaning gas supply system configured to supply a first cleaning gas from a supply port installed at a first portion in the exhaust pipe directly into the exhaust pipe;
a second cleaning gas supply system configured to supply a second cleaning gas into the process vessel; and
a controller configured to control the processing gas supply system, the exhaust part, the first cleaning gas supply system and the second cleaning gas supply system so as to perform:
processing the substrate in the process vessel by supplying the processing gas to the substrate and exhausting the processing gas from the exhaust part;
cleaning an interior of the exhaust part by supplying the first cleaning gas from the supply port installed in the exhaust pipe directly into the exhaust pipe; and
cleaning an interior of the process vessel by supplying the second cleaning gas into the process vessel,
wherein a frequency of performing the act of cleaning the interior of the exhaust part is set higher than a frequency of performing the act of cleaning the interior of the process vessel, and
wherein the act of cleaning the interior of the exhaust part is performed in a state in which an opening configured to take the substrate into and out of the process vessel is not opened but sealed and in a state in which an exhaust valve, which is installed at a second portion in the exhaust pipe at a more upstream side than the first portion in an exhausting direction in the exhaust pipe and configured to open or close the exhaust pipe, is fully closed to prevent the first cleaning gas from being supplied into the process vessel from the supply port.

13. A non-transitory computer-readable recording medium storing a program that causes a substrate processing apparatus to perform a process by a computer, the process comprising:
processing a substrate in a process vessel of the substrate processing apparatus by supplying a processing gas to the substrate and exhausting the processing gas from an exhaust part including an exhaust pipe and a pump;
cleaning an interior of the exhaust part by supplying a first cleaning gas from a supply port installed at a first portion in the exhaust pipe directly into the exhaust pipe; and
cleaning an interior of the process vessel by supplying a second cleaning gas into the process vessel,
wherein a frequency of performing the act of cleaning the interior of the exhaust part is set higher than a frequency of performing the act of cleaning the interior of the process vessel, and
wherein the act of cleaning the interior of the exhaust part is performed in a state in which an opening configured to take the substrate into and out of the process vessel is not opened but sealed and in a state in which an exhaust valve, which is installed at a second portion in the exhaust pipe at a more upstream side than the first portion in an exhausting direction in the exhaust pipe and configured to open or close the exhaust pipe, is fully closed to prevent the first cleaning gas from being supplied into the process vessel from the supply port.

* * * * *